(12) United States Patent
Angert et al.

(10) Patent No.: US 6,923,651 B2
(45) Date of Patent: Aug. 2, 2005

(54) SHEET MATERIAL HAVING METAL POINTS AND METHOD FOR THE PRODUCTION THEREOF

(75) Inventors: Norbert Angert, Darmstadt (DE); Dobri Dobrev, Darmstadt (DE); Reinhard Neumann, Darmstadt (DE); Johann Vetter, Darmstadt (DE)

(73) Assignee: Gesellschaft fuer Schwerionenforschung mbH, Darmstadt (DE)

(*) Notice: Subject to any disclaimer, the term of this patent is extended or adjusted under 35 U.S.C. 154(b) by 0 days.

(21) Appl. No.: 10/952,974

(22) Filed: Sep. 29, 2004

(65) Prior Publication Data

US 2005/0064139 A1 Mar. 24, 2005

Related U.S. Application Data

(63) Continuation of application No. 10/415,445, filed on Aug. 20, 2003.

(30) Foreign Application Priority Data

Oct. 30, 2000 (DE) .......................................... 100 53 857
Nov. 9, 2000 (DE) .......................................... 100 55 482

(51) Int. Cl.$^7$ .............................................. H01R 12/00
(52) U.S. Cl. .......................... 434/67; 216/56; 216/87; 428/131
(58) Field of Search .............................. 439/67, 74, 65, 439/71, 69; 216/56; 2/87; 428/131

(56) References Cited

U.S. PATENT DOCUMENTS

| | | | | |
|---|---|---|---|---|
| 3,662,178 A | * | 5/1972 | Caputi et al. ............. | 250/472.1 |
| 3,713,921 A | * | 1/1973 | Fleischer et al. .............. | 216/87 |
| 3,802,972 A | * | 4/1974 | Fleischer et al. .............. | 216/57 |
| 4,732,646 A | * | 3/1988 | Elsner et al. ................ | 438/694 |
| 4,820,548 A | * | 4/1989 | Courduvelis et al. .......... | 427/98 |
| 4,832,997 A | * | 5/1989 | Balanzat et al. ............. | 428/131 |
| 4,956,219 A | * | 9/1990 | Legras et al. ................ | 343/771 |
| 5,056,216 A | * | 10/1991 | Madou et al. ................ | 29/843 |
| 5,462,467 A | * | 10/1995 | Macaulay et al. ............. | 445/50 |
| 5,559,389 A | * | 9/1996 | Spindt et al. ................ | 313/310 |
| 5,562,516 A | * | 10/1996 | Spindt et al. ................. | 445/24 |
| 5,564,959 A | * | 10/1996 | Spindt et al. ................. | 445/24 |
| 5,578,185 A | * | 11/1996 | Bergeron et al. ........... | 205/123 |
| 5,827,099 A | * | 10/1998 | Spindt et al. ................. | 445/24 |
| 5,913,704 A | * | 6/1999 | Spindt et al. ................. | 445/24 |
| 6,033,583 A | * | 3/2000 | Musket et al. ................ | 216/56 |
| 6,444,256 B1 | * | 9/2002 | Musket et al. .............. | 427/117 |
| 6,503,409 B1 | * | 1/2003 | Fleming ...................... | 216/56 |

* cited by examiner

*Primary Examiner*—Ross Gushi
(74) *Attorney, Agent, or Firm*—Frommer Lawrence & Haug LLP; Ronald R. Santucci (57) ABSTRACT

The invention relates to a sheet material having metal points (8) and surfaces (2 and 3) located opposite one another, wherein the sheet material (1) has through-holes (4) from one surface (2) to the surface (3) located opposite. Those through-holes (4) are filled with needle-point-shaped conical pins (5) or through-contacts (6) of electrically conducting material, whereas the surrounding sheet material in a preferred embodiment of the invention consists of an insulating plastics material (7). In a further embodiment of the invention, instead of the insulating plastics material (7) there are provided needle-shaped pins that are surrounded by air or some other gaseous medium. The invention further relates to a method for the production of such a sheet material (1) and to forms of use of the sheet material (1).

55 Claims, 8 Drawing Sheets

SHEET MATERIAL HAVING METAL POINTS AND METHOD FOR THE PRODUCTION THEREOF

CROSS-REFERENCE TO RELATED APPLICATION

This application is a continuation of U.S. patent application Ser. No. 10/415,445 filed Aug. 20, 2003 entitled "Film Material Comprising Spikes and Method for the Production Thereof" which is a 371 filing of International Patent Application PCT/EP01/12323 filed Oct. 25, 2001 and which claims priority benefits of German Patent Application No. 100 53 857.6 filed Oct. 30, 2000 and German Patent Application No. 100 55 482.2 filed Nov. 9, 2000.

The invention relates to a sheet material having metal points, to uses of the sheet material and to methods for the production thereof, according to the preambles of the independent claims.

The publication U.S. Pat. No. 3,770,532 discloses a sheet material, and a method for the production thereof, having oppositely located surfaces and conical through-holes of substantially uniform size in a sheet of non-metallic material having a thickness of from 1 to 20 $\mu$m for the purpose of producing an article that can be used as a filter for separating molecules of disparate sizes.

For producing the conical through-holes, a polycarbonate sheet is irradiated with decay products of the Cf-252 atom in order to produce a track density of about $1\times10^6$ per $cm^2$ in the sheet. The beam tracks are then etched to form conical through-holes.

In that method it is disadvantageous that synthetic atoms such as Cf-252 which generate sufficient decay products per unit of time to ensure an adequate track density must first be produced in a nuclear reactor and selected by mass spectrometry. It is consequently not possible to use natural elements. Moreover, although it is possible to produce through-holes through sheets using this method, it is not possible to produce sheets having metal points.

The publication DE 196 50 881 A1 discloses a method for producing sheets from plastics material that in the z direction are electrically conductive and capable of establishing good contact and in the x/y direction are insulating, wherein micro-holes in the plastics material are occupied by metallic threads that have caps at their ends. This method therefore also provides through-holes through sheets but not sheets having metal points; rather, the aim of the known method is to obtain uniform, almost cylindrical metallic threads embedded in a plastics sheet.

The problem of the invention is to provide a sheet material having metal points, wherein the metal points either are embedded in the sheet material or project out from the sheet material. In addition, a method for the production-of such sheet materials is to be provided wherein no radioactive decay products of a synthetic atom are to be used and it is possible to dispense with the use of nuclear reaction products.

The problem is solved by the subject-matter of the independent claims. Features of advantageous developments of the invention are given in the subordinate claims.

In a first aspect of the invention, there is provided a sheet material having metal points and surfaces located opposite one another wherein the sheet material has, at a prespecified angle with respect to the surfaces, through-holes from one surface to the surface located opposite. The through-holes taper conically and have needle-point-shaped conical pins or through-contacts of electrically conducting material, whereas the sheet material consists of insulating plastics material. A sheet material of that kind has the advantage that it has needle-point-shaped pins, embedded in plastics material, which are located in the sheet material at an angle and extend from one surface to the surface located opposite. As a result, the sheet material has an extreme degree of anisotropy for both thermal conduction and electrical conduction.

In a first embodiment of the invention, the area density of the conically tapering pins or through-contacts is from $1\times10^5$ units per $cm^2$ to $1\times10^7$ units per $cm^2$, preferably from $5\times10^5$ units per $cm^2$ to $1\times10^6$ units per $cm^2$. This embodiment has the advantage that a high density of microscopically fine pins are embedded, insulated from one another, in the sheet without touching one another.

In a further embodiment of the invention, the metallic points of the pins or through-contacts project out from the sheet material on one side. The advantage thereof is that a high electrical field intensity can be established at the points, which can bring about increased electron emission from the projecting points.

In a further preferred embodiment of the invention, the thickness of the sheet material is from 10 $\mu$m to 400 $\mu$m, preferably from 20 $\mu$m to 300 $\mu$m. Such a thick sheet pierced by metallic points has the advantage that it is suitable for and adaptable to many applications.

In a further embodiment of the invention, the conical surface of the needle-shaped, conically tapering pins or through-contacts has a gradient in the region of the points of from 1:10 to 1:30. Such slender pins have the advantage that, on the one hand, they can form a high field intensity at their points and, on the other hand, they can penetrate deep into other materials for the purpose of establishing contact, especially when the points are made from a harder metal than the area with which contact is to be made.

In a further embodiment of the invention, the needle-shaped, conically tapering pins or through-contacts have, in their base region, a diameter of less than 10 $\mu$m, preferably of from 1 $\mu$m to 5 $\mu$m. In this embodiment, the area requirement for the base region is so small that, despite a high density of embedded metallic pins in the sheet material, the pins do not touch one another in the base region. This takes into account the principle that the higher the track density and, therefore, pin density, the smaller the diameter must be dimensioned in the base region.

In a preferred use of this sheet material, the sheet material is used as connecting material in the form of a connecting mat between structured conductor track surfaces of two electronic components. Wherever those structured conductor track surfaces have conductor tracks provided with oppositely located contact connection areas and/or at locations where exposed conductor track areas of the conductor tracks of the two electronic components cross one another, the said connecting mat automatically establishes coupling points by means of the densely distributed, needle-point-shaped, conically tapering pins or through-contacts. A connecting mat of that kind made from the sheet material has the advantage that the connecting mat makes contacts selectively and can be inserted even over a large area between the electronic components to be connected, without it being necessary to structure the connecting mat selectively.

In a further use of the sheet material, it is possible to use the sheet material as selectively electrically connecting material for an electronic component consisting of a plurality of stacked semiconductor devices, the sheet material being arranged between the respective devices. It has hitherto been necessary for such stacked devices to be provided with specially dimensioned and structured intermediate levels in order for the semiconductor devices being stacked to be connected to one another selectively. The work and cost involved for such specially dimensioned and structured intermediate levels can be reduced by means of the sheet material according to the invention.

In a further use of the sheet material, it is used as an electrically connecting intermediate layer between a semiconductor chip and a system carrier, the system carrier having conductor tracks with contact connection areas and the chip having contact areas, and the sheet material establishing, by means of its pins incorporated in an insulated arrangement, electrical connections between the contact areas of the chip and the contact connection areas of the system carrier that are located opposite. Such a use of the sheet material substantially reduces the costs of the connection between the system carrier and the chip.

For establishing contact in such a use of the sheet material, the sheet material covers at least the entire surface provided with contact areas on the active side of the semiconductor chip, the conductor tracks of the system carrier and/or the contact connection areas of the system carrier being arranged opposite the contact areas of the semiconductor chip. Establishing contact in that manner using the sheet according to the invention has the advantage that the sheet material does not have to be cut exactly to size but merely has to correspond approximately to the size of the semiconductor chip, it only having to be ensured that the size of the sheet is not smaller than the size of the semiconductor chip.

In a second aspect of the invention, the sheet material has, on its surface on the needle-base side, a metal coating connected to the base ends of the conically tapering pins or through-contacts. This continuous metal coating provides for an increase in the stability of the sheet. At the same time, the above-mentioned uses cannot be carried out using such a metal-coated sheet because the base ends are short-circuited as a result of the metal coating. A further field of use is, however, obtained for this kind of sheet because the continuous metal coating can be structured by means of photolithography and etching technology.

In an embodiment of the second aspect of the invention, the plastics material is dissolved away in the region of the points of the conically tapering pins or through-contacts and a cavity is arranged around the points. This embodiment has the advantage that the exposed points, at appropriately high field intensities, provide increased electron emission so that such sheet material provided with a continuous metal layer on the surface on the base side and with exposed metallic points can be used for electron emission components.

In a further embodiment of the invention, the cavities around the points or around the points of the through-contacts are filled with metallic material and the points are extended by means of the metallic material. By means of this embodiment, it is advantageously possible for large-area contacts to be established also on the point-side surface of the sheet material according to the invention. By suitable selection of the material in the cavity and for extending the points, the sheet can also be used for fixed connections to contact areas or contact connection areas.

In a further embodiment of the invention, a solder is provided as the metallic material for filling and for extending the points. As a result of such a solder or solder ball at the points, it is possible for soldered or bonded connections to be established.

In a further embodiment of the invention, the metal coating on the surface on the needle-base side has a conduction pattern. This conduction pattern has the advantage that the surface on the needle-base side can be provided with circuitry, which can be in operative connection with a device by way of the needle-shaped points.

In a further embodiment of the invention, the metal coating has a conduction pattern of a system carrier having contact connection areas for making contact with contact areas of a semiconductor chip. This embodiment of the invention makes possible entirely new structuring of system carriers for semiconductor chips. The costs for the system carriers and especially the costs for connecting the system carrier to the semiconductor chip can be substantially reduced by means of the sheet according to the invention.

A use of the sheet material of a variant of the second aspect of the invention provided with a structured metal coating and with needle-shaped, conically tapering pins or through-contacts embedded in a plastics layer, as a system carrier for an electronic component having a semiconductor chip arranged on the system carrier has the advantage that, in flip-chip technology, it is possible to dispense with contact bumps on the semiconductor. As a result, the manufacture of semiconductor chips and semiconductor components of that type is made substantially simpler and cheaper.

A use of the sheet material provided with a structured semiconductor coating and with needle-shaped, conically tapering pins or through-contacts embedded in a plastics layer, the points of which are extended by means of solder material, is intended for the production of electronic components having a semiconductor chip arranged on the sheet material forming the system carrier and connected to the solder material by means of its contact areas. This use has the advantage that it can completely replace the system carriers that are customary today, together with the additional advantage that a system carrier based on the present invention already has available on its conductor tracks the contact bumps which are otherwise customarily arranged on the chip.

According to a third aspect of the invention, a sheet material of metal having metal points and surfaces located opposite one another has, on at least one surface, needle-shaped pins which protrude from the surface of the sheet at a prespecified angle and have, in the base region of the pins, a diameter of less than 10 $\mu$m, preferably of from 1 to 5 $\mu$m. This aspect of the invention makes use of the advantage that, especially for electron emission components, no insulating material is arranged between the metallic points.

In an embodiment of the third aspect of the invention, the thickness of the sheet material, without pins, is from 10 to 50 $\mu$m. The pins have a length of from 10 $\mu$m to 400 $\mu$m, preferably from 20 $\mu$m to 300 $\mu$m. By means of such fine pins of such a length on the surface of a relatively thin metal sheet, the said metal sheet can advantageously compensate for gaps between surfaces between which contact is to be made. Especially when uneven regions are present because of a coarse, rough surface, the fine, long pins will compensate for the disparate gaps between two components to be connected.

In a further preferred embodiment, the cone of the pins narrows in the region of the point in a ratio of from 1:10 to 1:30. This slender narrowing has the advantage that relatively high field intensities, which give rise to increased electron emission, can form at the points.

In a further embodiment of the invention, the area density of the pins is from $1\times10^5$ pins per cm$^2$ to $1\times10^7$ pins per cm$^2$, preferably from $5\times10^5$ pins per cm$^2$ to $1\times10^6$ pins per cm$^2$. Such a dense and fine distribution of the pins has the advantage that it becomes possible for an intensive contact to be established on the side where the pins are located and, in addition, the pins can penetrate into a contact material that is appropriately matched in terms of its surface hardness, for establishing contact intensively. Also, for the use of the sheet in an electron emission component, the high point density results in more uniform emission of electrons above the surface. For that reason, a preferred embodiment and use of the sheet material made from metal is provided for electron emission components.

This sheet material according to the third aspect of the invention can, however, also be advantageously used for press-on contact areas in semiconductor technology. Because of the continuous metal coating or continuous metal sheet, from which the needle-point-shaped pins project, this material is especially suitable for compensating for uneven regions and, by means of the points, for introducing into a second material.

A method for the production of a sheet material having metal points and having needle-shaped, conically tapering metallic pins or through-contacts comprises the following method steps:

irradiating a plastics sheet with ion beams at a prespecified angle,
  etching the ion beam tracks in the plastics sheet to form needle-shaped, conically tapering through-holes having a surface on the needle-point side and a surface located opposite on the needle-base side,
  depositing a metal surface on the surface on the needle-point side of the etched sheet,
  filling the through-holes with metal pins or metallic through-contacts by means of electrodeposition of metal in the through-holes,
  etching away the continuous metal layer on the surface on the needle-point side.

By means of this method, there is advantageously formed a sheet material that consists substantially of plastics material, with use being made of the electrically insulating action of a plastics material, so that needle-shaped, conically tapering metallic pins to be embedded in the plastics sheet are incorporated in a perpendicular orientation or at a prespecified angle between the surfaces of the plastics sheet that are located opposite one another.

The method moreover has the advantage that ions, and not radioactive decay products, are used, especially as those ions can be accelerated and, with a prespecified ion energy and in a prespecified dose, can mark out ion beam tracks in the plastics sheet. As a result of etching the ion beam tracks, needle-shaped, conically tapering through-holes are first created between the oppositely located surfaces, the diameter of the through-holes advantageously being adjustable by means of the etching time.

The deposition of the metal layer on the surface of the etched sheet on the needle-point side serves only to produce an electrode for the subsequent process of electrodeposition of the metal in the through-holes. That has the advantage that, on deposition of the metal from an electroplating bath, the metal grows within the through-holes from the point region to the base region, the diameter of the metallic pin being formed in the through-holes increasing at the same time. By that means it is ensured that an accurate point forms from the surface on the needle-point side, which is not ensured if the base-side surface is coated with metal with simultaneous partial coating of the inner walls of the through-holes because there is a risk that the needle base will close off the through-hole, which tapers to a point, before the needle point is reached and, as a result, it will not be possible to form perfect needle-point-shaped metallic pins.

The subsequent etching away of the continuous metal layer on the surface on the needle-point side serves merely to remove the electrical short-circuit and, as a result, to produce pins that are in an insulated arrangement in a sheet material.

For the production of a sheet material according to the second aspect of the invention, a continuous metal layer is deposited on the base-side surface, after the through-holes have been filled with metal by means of the electrodeposition of metal in the through-holes. As a result, the needle-shaped metal pins are provided with a metal layer both on the point-side surface and on the base-side surface; in this instance too, however, the metal layer is etched away on the surface on the needle-point side so that a sheet material is provided which consists of a metal layer and a plastics layer, with needle-shaped pins passing through the plastics layer.

For the purpose of exposing the needle-shaped metallic points, the plastics sheet material can be partially dissolved away on the point-side surface to form a cavity surrounding the points. By that means, a sheet material is produced which has exposed points that project out from a plastics material and are surrounded by a cavity that material being especially suitable for electron emission components.

In a further preferred implementation example of the method, the metal coating on the needle-base side of the sheet material can be structured to form conductor tracks and/or contact connection areas and/or external contact tabs. In that embodiment, the material acting as carrier is the plastics material, the structured metal coating serving only as circuitry and for electrical access to the pins embedded in the insulating plastics material. A sheet material structured in that manner can preferably be used as a system carrier in semiconductor technology, it being possible for the structured metal coating to have conductor tracks having contact connection areas and/or external contact tabs at their ends.

In a further preferred implementation example of the method, for filling the cavities or extending the points, a metallic material is deposited at the exposed metallic metal points by means of electrodeposition. That material then fills the cavities produced around the metal points in the plastics sheet and, as a result, increases the radius and the contact area of the metallic points of the needle-shaped pins. Such an implementation example is especially interesting when a solder material deposited at the exposed needle-shaped metallic points is used as the material in the cavities and for extending the needle points. As a result, the possibility is provided that, instead of producing bumps on the semiconductor chip, for example in flip-chip technology, it is now possible to produce bumps on a system carrier when the continuous metal coating is, at the same time, structured to form a circuit. The outlay expended on forming bump contacts on the corresponding contact areas of a chip can be avoided by using a substrate carrier prepared in this manner, it being perfectly adequate to provide only flat contact areas on the chip.

The application of a solder material onto the microscopically fine and densely distributed points of the sheet material can be brought about by using a flow bath method. For that purpose, the surface on the needle-point side of the sheet material having exposed points and appropriately prepared cavities is passed over a bath of liquid solder, the solder wetting only the points with ball-shaped droplets of solder and the remaining surface of insulating material remaining free from solder. A further possibility is to pass the prepared sheet through an immersion bath. This method has the advantage that not only are ball-shaped droplets of solder formed on the surface on the needle-point side but, at the same time, the metal coating on the surface on the needle-base side can be made thicker.

A method for the production of a material according to the third aspect of the present invention comprising a metal sheet having metal points and exposed needle-shaped pins comprises the following method steps:

irradiating a plastics sheet with ion beams at a prespecified angle, etching the ion beam tracks in the plastics sheet to form needle-point-shaped, conically tapering through-holes having a surface on the needle-point side and a surface located opposite on the needle-base side, depositing a metal layer on the surface on the needle-point side of the etched sheet, filling the through-holes with metal pins by means of electrodeposition of metal in the through-holes, applying a connecting metal layer to the surface on the needle-base side, etching the continuous metal layer on the surface on the needle-point side, completely dissolving away the plastics sheet material between the needle-shaped points.

In this method, the plastics sheet of the present invention is used solely as a shape-giving means for the production of a metal sheet having metal points and exposed needle-shaped pins. After the metal sheet having exposed needle-shaped pins has been completed, the shape-giving plastics sheet is completely dissolved away; for that purpose, a continuous metal layer forming a self-supporting sheet is deposited on the base-side surface. That freely supporting metallic sheet has a thickness of from 10 to 50 $\mu$m, whereas the pins have a length of from 10 $\mu$m to 400 $\mu$m, preferably from 20 to 300 $\mu$m. The diameter in the base region of each pin is less than 10 $\mu$m and preferably from 1 to 5 $\mu$m, and the rounding-off radius at the points is from 20 nm to 100 nm.

The shape-giving plastics sheet is preferably of poly (bisphenol A carbonate) in a thickness d of from 10 $\mu$m to 400 $\mu$m, and the ions are heavy ions, preferably uranium $U^{238}$ ions. Heavy ions of that kind can be accelerated by virtue of their electric charge, so that the sheet material of poly(bisphenol A carbonate) can be irradiated. For that purpose, the heavy ions are preferably accelerated to a kinetic energy of from 8 to 15 MeV.

In a further preferred implementation example of the method, there is established an ion irradiation density of from $1\times10^5$ ions per cm$^2$ to $1\times10^7$ ions per cm$^2$, preferably from $5\times10^5$ ions per cm$^2$ to $1\times10^6$ ions per cm$^2$. At such a density, the through-holes to be etched are also distributed in highly concentrated manner in the sheet material and provide a resilient cushion between corresponding contact areas to be connected. This method variant proves advantageous especially in the case of large-area press-on contact areas as are in some cases required for liquid crystal display screens or for large-area electron emission components for exciting liquid crystal areas.

In a preferred implementation example of the method, for etching the ion beam tracks in the plastics sheet, there is used a 6-molar sodium hydroxide solution containing 10% methanol by volume for the purpose of etching the ion beam tracks at a temperature of from 310 to 320 K to form unilaterally arranged conical through-holes within a period of from 5 to 16 hours, preferably of from 6 to 10 hours. As the etching solution attacks the sheet surface from only one side, an etching-stopping solution, preferably consisting of 5% sulphuric acid, is applied on the other side, bringing the etching process to a close as soon as the other surface has been breached in the etching process.

In order to bring the etching process to a definite close, it is ensured that, as soon as the other surface is breached by the etching solution, the etching-stopping solution penetrates into the etched through-holes as a result of applying to the etching-stopping solution a pressure differential of from 100 to 200 hPa with respect to atmospheric pressure. This pressure differential forces the etching-stopping solution through the fine openings at the points of the through-holes. The higher the pressure differential, the smaller the rounding-off radius of the points.

In a further preferred implementation of the method, deposition of a continuous metal layer on the surface on the needle-point side of the etched sheet is carried out by means of sputtering, preferably sputtering of gold, and the sputtered layer is then made thicker by electrodeposition or electroplating using a copper alloy. The conical through-holes can then be filled by means of electrodeposition of copper.

Exposure of the points of the deposited metallic conical pins is preferably carried out by partially dissolving away the plastics sheet using dichloromethane. Completely dissolving away the plastics sheet material between the needle-shaped pins on the metal coating on the needle-foot side is also preferably carried out using dichloromethane.

Further features, advantages and embodiments of the invention will now be described in greater detail with reference to the accompanying figures.

FIG. 5h shows a variant of the second implementation example of the method according to the invention;

Figure 1:
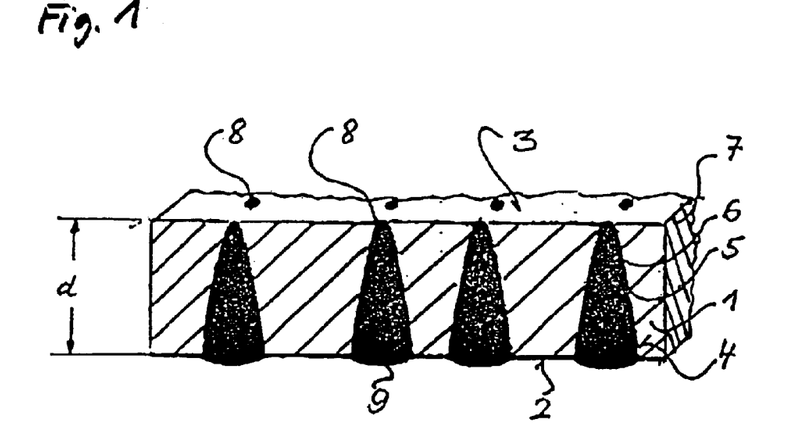
FIG. 1 shows a first embodiment of the sheet material according to the invention.

FIG. 1 shows a first embodiment of the sheet material according to the invention. In FIG. 1, reference numeral 1 denotes the sheet material, reference numeral 2 denotes a surface on the needle-base side, reference numeral 3 denotes a surface on the needle-point side, reference numeral 4 denotes a through-hole through the sheet material, reference numeral 5 denotes a needle-point-shaped conical pin, reference numeral 6 denotes a through-contact, reference numeral 7 denotes a plastics material and reference numeral

8 denotes a metallic point, and reference letter d denotes the thickness of the plastics sheet 7.

The needle-point-shaped conical pins 5 are embedded, insulated from one another, in the plastics material 7 so that only their base region 9 in the surface 2 on the needle-base side and their metallic point 8 in the surface 3 on the needle-point side are free from plastics material. The needle-point-shaped conical pins 5 can accordingly serve as through-contacts from the surface on the needle-base side to the surface on the needle-point side of the sheet, which in this embodiment has a thickness d of from 10 μm to 40 μm.

The diameter of the pins in the base region 9 is less than 10 μm; it is preferably, as in this example, from 1 to 5 μm. The area density of the needle-shaped pins 5 is essentially dependent upon the diameter in the base region 9 and therefore must not exceed a prespecified area density. In this implementation example of FIG. 1, the area density is $1\times10^6$ per cm$^2$ and can, if the diameter in the base region is reduced, increase up to $1\times10^7$ per cm$^2$ without the needle-shaped pins touching in the base region. The rounding-off radius of the metallic points 8 in the embodiment according to FIG. 1 is from 20 to 100 nm, whereas the gradient of the line of the outer conical surface in the region of the points is from 1:10 to 1:30.

The sheet material of FIG. 1 can be used as a connecting mat between structured conductor track surfaces of two electronic components, especially as it then automatically forms coupling points for the two electronic components without itself having to be structured, that is to say the sheet can be laid in its entirety between the components to be coupled and, at the moment when the components and their contact areas are pressed against one another, coupling points are automatically formed, by means of the metallic needle-shaped pins embedded in the plastics sheet material, at the respective locations provided on the two components. Such coupling can be carried out wherever conductor tracks have oppositely located contact connection areas and/or at locations where exposed conductor track areas of the conductor tracks of the two oppositely located electronic components cross one another.

When semiconductor devices are stacked to form a hybrid electronic component it is necessary to create, between the devices, through-contacts which provide an electrical connection or electrical contact between the stacking levels at intended locations. Here too, the sheet material from the example of FIG. 1 is an ideal coupling material because, without having to structure the sheet material, it can be stacked in the form of an intermediate level between the individual semiconductor devices and also, as a result, at those locations where oppositely located contact areas of the semiconductor devices are to be connected, it can establish the said connection.

An especially advantageous possible use of the sheet material according to FIG. 1 also consists in the fact that contact connection areas on metallic system carriers for electronic components can be connected to contact areas on semiconductor chips by arranging the sheet, as shown in principle in FIG. 1, between the system carrier and the semiconductor chip, without structuring the sheet itself. Merely by lightly pressing the semiconductor chip against the system carrier with the sheet material according to FIG. 1 located inbetween, an electrical connection between the semiconductor chip and the system carrier is made wherever, on the one hand, contact areas are provided on the semiconductor chip and contact connection areas are arranged in an opposite location on the system carrier. For that purpose, the active side of the semiconductor chip (the active side bearing such contact areas on its surface) can be pressed onto the intermediate sheet analogously to flip-chip technology.

Figure 2:
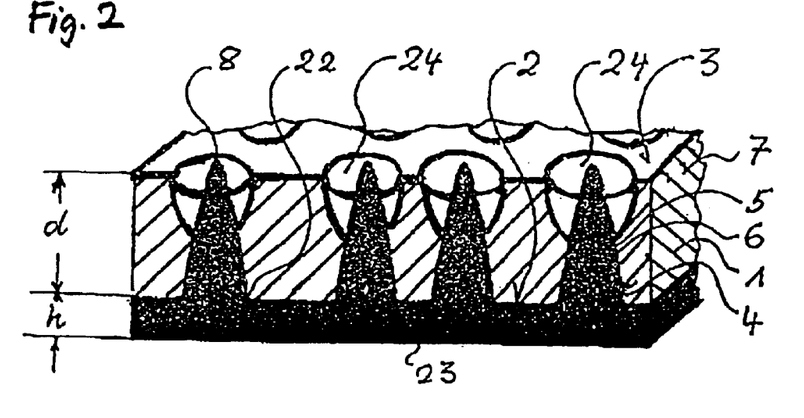
FIG. 2 shows a second embodiment of the sheet material according to the invention.

FIG. 2 shows a second embodiment of the sheet material according to the invention. Identical components in FIG. 2 that fulfil the same function as in FIG. 1 are denoted by the same reference numerals and are not described again.

In contrast to the first embodiment according to FIG. 1, the second embodiment of FIG. 2 has a metal coating 23 of thickness h connecting the base regions on the surface 2 on the needle-base side. Such a sheet material has the advantage, compared to FIG. 1, that this metal coating can be structured so that conductor-tracks with or without contact connection areas and/or external contact tabs can be produced on the needle-base side. Such a structured sheet having embedded needle-shaped pins can be directly used as a system carrier in the technology of modern electronic components, the needle-point side connecting the contact areas of a semiconductor chip to the conductor tracks of the structured metal coating 23 at those locations where contact areas are arranged on the semiconductor chip.

Besides the additional structurable metal coating 23, FIG. 2 shows cavities 24 around each metallic point 8 so that the metallic point 8 is completely free from plastics material. Such exposure of the metallic points 8 has the advantage that, for electron emission components, intensive electron emission becomes possible at the points 8 of the sheet material when an appropriate field intensity occurs in concentrated manner at the points 8, it being possible for that electron emission in turn to cause appropriate materials opposite the surface on the needle-point side to be excited to fluorescent illumination. In that process, the structurable metallic coating 23 can be used as one of the electrodes for generating the necessary field intensity.

By structuring the metal coating 23 it is consequently possible to produce flat illuminated display screens. For such an embodiment, the metal coating 23 can be made extremely thin so that it becomes translucent. It can, furthermore, be coated with an electrically conducting oxide, such as indium oxide, which is as transparent as a sheet of glass and electrically conducting. As a result, by means of the sheet material according to the invention, it is possible to produce high-precision flat display screens.

The geometry of the needle-shaped pins embedded in the plastics material and the area density of those pins is within the same range as in the first embodiment of the invention according to FIG. 1. The thickness of the sheet material d is also within the same ranges of from 10 to 400 μm, depending upon the intended application. The thickness of the metal coating can be from a few nanometres to several micrometres depending upon the intended application. When the metal coating is just a few nanometres, it is usually thickened to a thickness h of several micrometres by means of an electrically conducting glass, such as indium oxide. In such a case, the coating 23 is then a laminated glass coating having electrically conducting properties.

In a variant of the second embodiment according to FIG. 2, the cavities can be filled with a further material, such as a solder material, so that not only is it possible to produce press-on contacts but metallic connections to, for example, contact areas on semiconductor chips become possible. In order to fill the cavities at the metallic points 8 with solder, a simple immersion method can be carried out in a bath of solder or the surface on the sheet-point side of the sheet material can be passed over a flow bath of solder.

Because of the wetting properties of the solder in relation to the metallic points 8, a ball of solder having a diameter of a few nanometres forms on each point 8, whereas the non-wetting plastics material remains free from solder. Such a variant of the second embodiment of the invention has the advantage, moreover, that in flip-chip technology the chips themselves no longer need to be provided with contact bumps at their contact areas because that function can now be taken over by the balls of solder on the metal points 8.

In addition, the metal coating 23 for this intended application can be structured into contact connection areas and external contact tabs and can form a complete system carrier. Such a system carrier has the function of enlarging the microscopically small contact areas on the semiconductor chip to form mechanically connectible and contactable external contact tabs. Such system carriers moreover fulfil the function of potentially making available an additional wiring level in order to wire up a plurality of semiconductor chips on the system carrier to one another.

The cavities 24 shown in FIG. 2 in the region of the metallic points 8 can be made by partially dissolving away the plastics material using dichloromethane.

Figure 3:
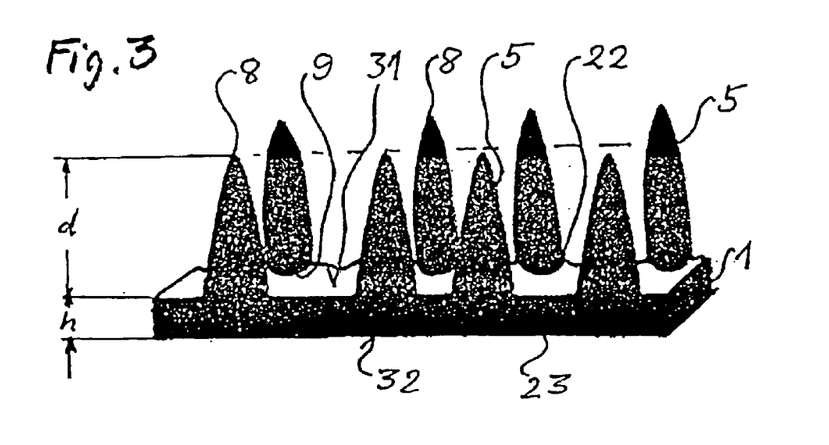
FIG. 3 shows a third embodiment of the sheet material according to the invention.

FIG. 3 shows a third embodiment of the sheet material according to the invention. Components of the third embodiment of the invention in FIG. 3 that fulfil the same functions as in FIG. 1 or in FIG. 2 are denoted by the same reference symbols and are not described again. The basic difference from the embodiments according to FIG. 1 and FIG. 2 is that, in FIG. 3, the plastics sheet has been completely dissolved away so that there is a pure metal sheet of thickness h having needle-shaped pins on one of the surfaces, which pins have a height that corresponds to the thickness d of the plastics sheet dissolved off or dissolved away.

Such a sheet material of metal having metal points and surfaces located opposite one another, wherein the metal sheet has, on at least one surface, needle-shaped pins which protrude from the sheet surface at a prespecified angle and which, in the base region of the pins, have a diameter of less than 10 $\mu$m, preferably from 1 to 5 $\mu$m, can advantageously be used as a planar electron emission material because, when a potential is applied to the metal sheet, a high field intensity is formed at the metallic points 8, which have a rounding-off radius of a few nanometres, so that the work function for electrons at those sites of high field intensity is overcome. Because of the high density of from $1 \times 10^5$ pins per cm$^2$ to $1 \times 10^7$ pins per cm$^2$, preferably from $5 \times 10^5$ pins per cm$^2$ to $1 \times 10^6$ pins per cm$^2$, there appears over a macroscopically large area an electron emission cloud, which can be used for a very wide range of application areas.

Other application areas of this metallic sheet are planar press-on contacts, wherein the said sheet is placed in an intermediate location and, by virtue of the dense, fine, needle-shaped pins, can compensate for unevenness or roughness between two metallic surfaces between which contact is to be made, because the pins in that region are extremely resilient and compensate for roughness and unevenness whilst, at the same time, giving good contact.

Figures 4, 4A:
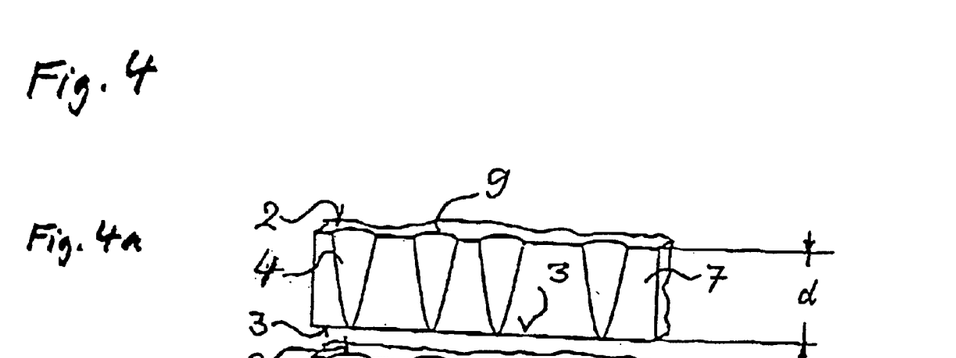
FIG. 4 shows, by means of FIGS. 4a to 4e, production steps of a first preferred implementation example of the method according to the invention.

FIG. 4 shows, by means of the FIGS. 4a to 4e, production steps of a first preferred implementation example of the method according to the invention. In this implementation example of the method, a sheet material is formed as shown by the first embodiment according to FIG. 1, starting first with a sheet of plastics material 7 which, in this embodiment, consists of a poly(bisphenol A carbonate) having a thickness of from 10 to 400 $\mu$m.

Figure 7:
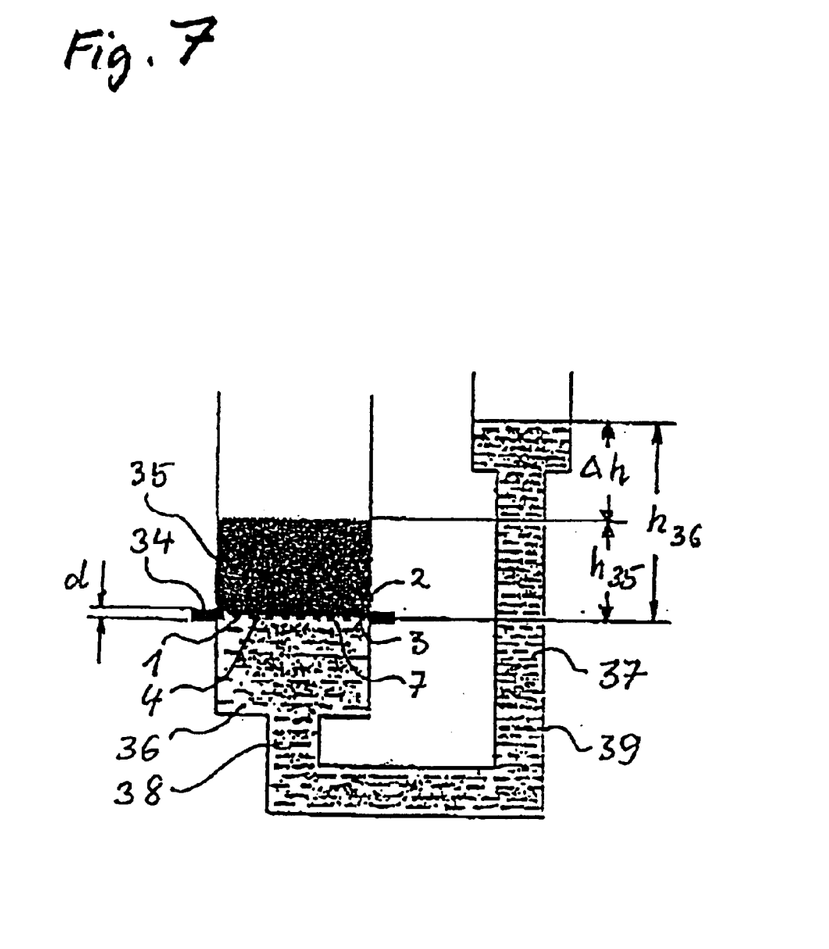
FIG. 7 shows an apparatus for carrying out the etching step of the production method according to the invention.

This sheet material is so bombarded with ions that an area density of ion beam tracks of from $1 \times 10^5$ tracks per cm$^2$ to $1 \times 10^7$ tracks per cm$^2$, preferably from $5 \times 10^5$ tracks per cm$^2$ to $1 \times 10^6$ tracks per cm$^2$, is formed in the sheet. In the implementation example of FIG. 4, heavy ions such as uranium $U^{238}$ ions are accelerated and the sheet is bombarded with those ions. The ion tracks are then etched out from one side, starting from the surface 2 on the needle-base side, in an etching apparatus, as shown in FIG. 7.

As a result, funnel-shaped or needle-shaped through-holes 4, as shown in FIG. 4a, are formed when an etching-stopping solution is applied from the side located opposite, that is to say to the face of the surface 3 on the needle-point side, the etching-stopping solution being so subjected to a differential pressure with respect to the pressure on the surface on the needle-base side that, as soon as through-etching is achieved, the etching-stopping solution flows into the opening of the through-hole on the needle-point side and stops the etching process. Such an etching-stopping solution is, for example, a 6-molar sodium hydroxide solution which is mixed with 10% methanol by volume.

The methanol advantageously ensures that organic compounds adhering to the surface of the sheet material are dissolved away whereas the sodium hydroxide solution itself brings etching to a stop, overcoming the etching solution. For etching through the sheet having a thickness d of from 10 to 400 $\mu$m, a time of from 2 to 10 hours is required, the etching solution being maintained at a temperature of from 310 to 320 K. A time of from 6 to 10 hours is preferred for the etching process. Although the sheet material, as shown in FIG. 4, shows that the plastics material 7 is dissolved away in the shape of needle points in the region of the ion tracks, the ion track itself is cylindrical and extends through the entire material. That cylindrically shaped ion track is utilised for the second embodiment of the invention, as shown in FIG. 2, and its production method shown in FIG. 5.

Figure 4B:
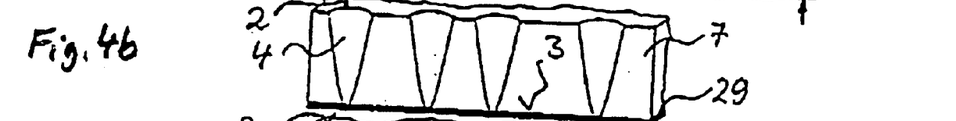
Figures 4C, 4D:
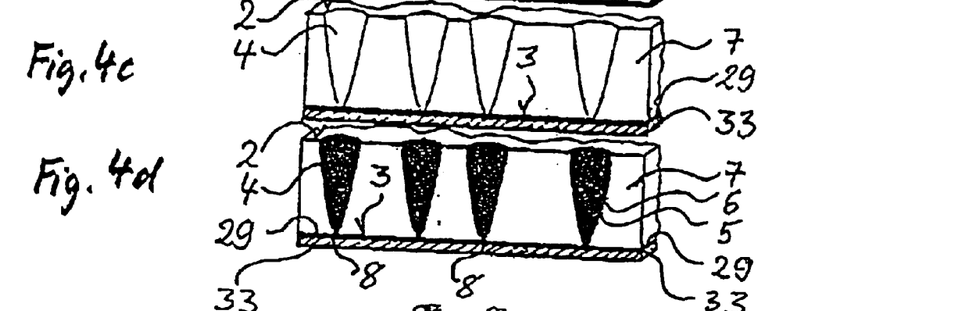

After etching the needle-point-shaped through-holes 4 into the sheet material from one side, in the next step, as shown by FIG. 4b, a continuous thin metal layer of a few nanometres is sputtered onto the surface 3 on the needle-point side. That sputtered layer 29 connects the openings of the through-holes 4 on the needle-point side and can, as shown in FIG. 4c, be made thicker by means of a metal layer 33 additionally applied by electrodeposition. That metal layer 33 applied by electrodeposition is then used as an electrode, in order to fill the needle-point-shaped through-holes 4 with a metal to form needle-shaped pins 5 as shown in FIG. 4d. Gold is preferably used for the sputtering of the thin metal coating 29, whereas on application of the metal coating 33 by electrodeposition a copper alloy is deposited.

Figure 4E:
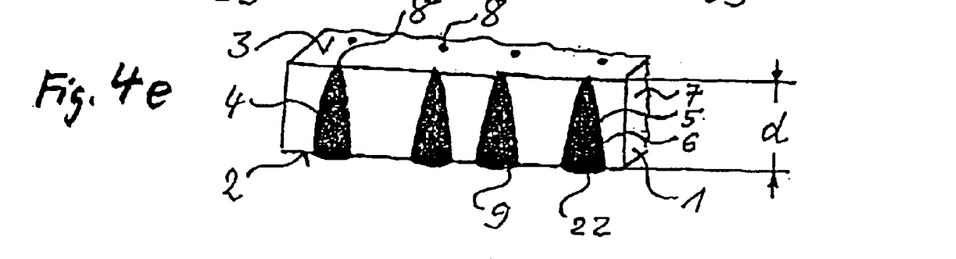

In the production step of FIG. 4d, the needle-shaped conical through-hole 4 is filled with a copper alloy or with a copper by means of electrodeposition. Finally, for production of an embodiment as shown in FIG. 1, the coating 33 applied by electrodeposition and also the sputtered coating 29 are etched away from the surface 3 on the needle-point side so that the needle-shaped pins, as FIG. 4e shows, are then located in the plastics sheet material insulated from one another. The many-facetted use of such a sheet which is pierced by metallic needle-shaped pins has already been described in detail and is therefore omitted at this point.

Figures 5, 5A:
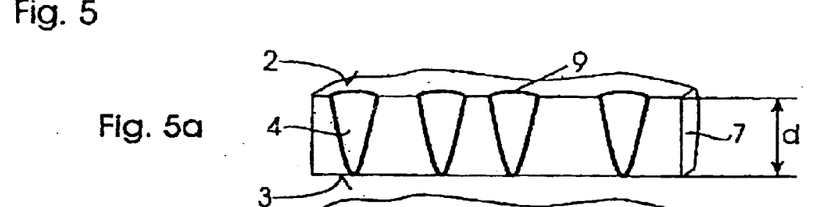
FIG. 5 shows, by means of FIGS. 5a to 5f, production steps of a second preferred implementation example of the method according to the invention.
Figures 5B, 5C:
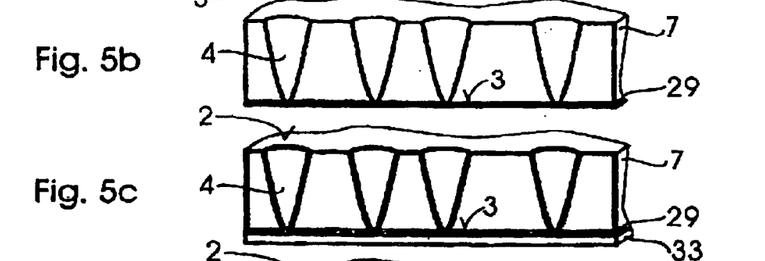

FIG. 5 shows, by means of FIGS. 5a to 5f, production steps of a second preferred implementation example of the method according to the invention for the production of the second embodiment of the sheet material according to the invention. As in FIG. 4, this production method also starts from a sheet material of bisphenol A carbonate, which is irradiated with heavy ions. The ion tracks, as shown by FIG. 5a, are etched to form needle-point-shaped through-holes 4 in the sheet material, a uniform density being maintained as already described in FIG. 4a. Then in FIG. 5b, analogously to FIG. 4b, a thin metal layer 29 is deposited on the surface 3 on the needle-point side by means of sputtering and then, in the step of FIG. 5c, that layer is made thicker, for example by means of electrodeposition, to form a metal coating 33.

Figure 5D:
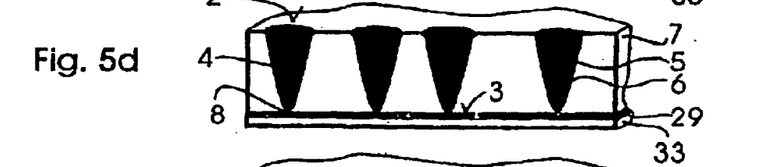
Figure 5E:
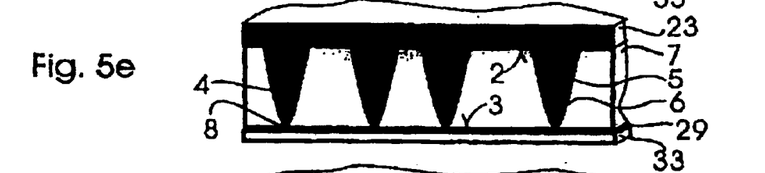

Starting from that coating, the through-holes are then, in FIG. 5d, filled with metal, which can be a copper alloy, which is deposited in the through-holes by electrodeposition with cathode potential being applied to the metal coating 33. In an additional method step, which is shown in FIG. 5e, the surface 2 on the base side of the sheet is made thicker by means of a coating 23 applied by electrodeposition. That coating 23 can, however, also be a combined coating of a thin deposited metal layer and an electrically conducting oxide such as indium oxide, if a translucent or transparent application is desired.

Figure 5F:
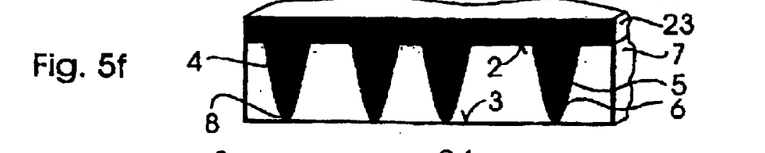

Already after the method step which is shown in FIG. 5f there is available a sheet which, on the one hand, has needle-shaped contact points on the needle-point side of the sheet and a metallic surface on the surface on the needle-base side. The said metallic surface can, in a further step (not shown), be so structured that a sheet having an electrical circuit is formed, it being possible to provide conductor tracks, external contact tabs and contact connection areas by means of that structuring.

Figure 5G:
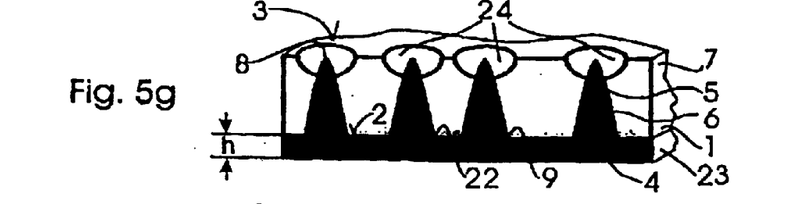

In order to enhance the action of the metal points 8 or to achieve better contactability, the sheet material can, in a further step, which is shown in FIG. 5g, be washed away, dissolved away or etched out, around the metallic points to form cavities 24, with use being made in this step of the fact that the ion tracks leave cylindrical tracks in the sheet material so that the etching solution used in step 4a and 4a then attacks the plastics material only to a limited extent, namely in the region of the cylindrical ion tracks. That results in cavities as desired, which form around the metallic points 8, as FIG. 5g shows.

In a further variation of the method, a process for extending the contact points and widening of the contact at the contact points 8 can subsequently be carried out. For that purpose, as FIG. 5h shows, a further metal material is deposited in the region of the cavities 24. That can be carried out in especially advantageous manner by the deposition of solder material, the surface on the needle-point side provided with cavities 24 being passed over a solder flow bath, in the process of which the wettability or the difference in wetting between the plastics material and the metallic point is exploited. Whereas the solder material clusters, in the form of a ball, around the metal point and, as a result, causes the metal point to be extended and widened, the surrounding plastics material is not wetted and consequently remains free from solder material. A material of that kind, as shown by FIG. 5h, can be used in many different ways, especially because in this case the coating 23, which can be either a pure metal coating or a combination coating of metal and conducting oxides, can be structured. The height h of the said coating is from 10 to 50 $\mu$m.

Figure 6A:
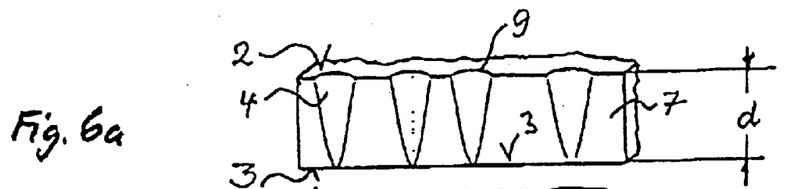
FIG. 6 shows, by means of FIGS. 6a to 6h, production steps of a third implementation example of the method according to the invention.
Figure 6B:
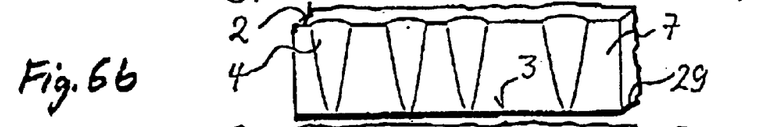
Figure 6C:
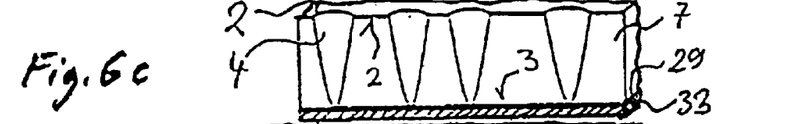

FIG. 6 shows, by means of FIGS. 6a to 6h, production steps of a third implementation example of the method according to the invention for the production of the third embodiment of the sheet material according to the invention. This implementation example also starts from a plastics sheet 7, which is correspondingly irradiated with ion beams as has already been shown for FIGS. 4 and 5, the sheet material having a thickness d of from 10 to 400 $\mu$m. After the through-holes 4 have been etched, as FIG. 6a shows, a thin metal layer 29 is deposited on the surface 3 on the needle-point side of the through-holes 4 by means of a further step, which is shown in FIG. 6b. The said thin metal layer deposited, which can be applied by either vapour-deposition or sputtering, can subsequently be made thicker by means of a layer 33 applied by electrodeposition, as shown in FIG. 6c.

Figure 6D:
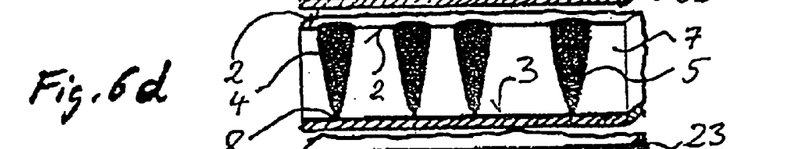
Figure 6E:
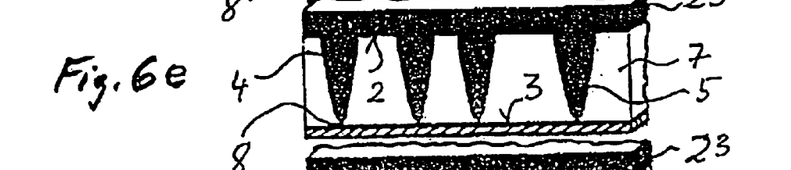
Figure 6F:
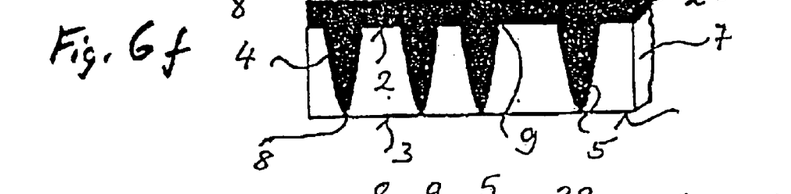

From the point side, the through-holes 4 are then so filled with metal that needle-shaped pins 5 are formed, as FIG. 6d shows. Finally, in the step that follows, which is shown in FIG. 6e, a metal layer connecting the base regions of the needle-shaped pins or a combination layer of metal and conducting oxides is deposited. That layer is denoted by reference numeral 23. Then, as FIG. 6f shows, the coating on the surface 3 on the needle-point side can be completely etched away and then, as. FIG. 6a shows, all the plastics material 7 which is still present in FIG. 6f is dissolved away using, for example, dichloromethane.

The method according to FIG. 6 results in the third embodiment of the invention, which consists of a sheet material of metal having metal points and surfaces located opposite one another, the metal sheet material itself having a thickness h of from 10 to 50 $\mu$m whereas the length of the needle-shaped metallic pins is from 10 to 400 $\mu$m, in dependence upon the thickness d of the plastics sheet 7. The area density of the pins on the metal sheet corresponds to the area density of the through-holes 4 and the area density of the ion beam tracks in the plastics material 7. The order of magnitude of the said density has already been described a number of times hereinbefore.

Figure 6H:
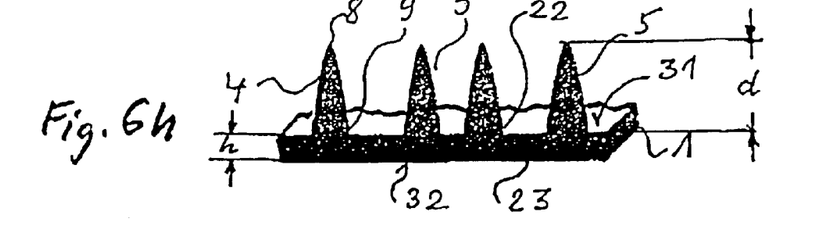

Such a sheet material, as FIG. 6h in principle shows, can be used as press-on contact material between two contact areas because, by virtue of the resilient points, it adapts to roughness and unevenness in the oppositely located contact areas. Such contact areas can be microscopic but can also have a large area.

FIG. 7 shows an apparatus for carrying out the etching step of the implementation examples of the production method according to the invention. For that purpose, the irradiated plastics sheet having an area density of ion beam tracks of from $1\times10^5$ tracks per cm$^2$ to $1\times10^7$ tracks per cm$^2$ is mounted in the form of a separating wall 34 between two columns of liquid 35 and 36. The column of liquid 35 comprises an etching solution which, in this implementation example, is a 6-molar sodium hydroxide solution containing 10% methanol by volume.

The proportion of methanol by volume can of course vary. However, it should and must be sufficient to dissolve away and remove organic contaminants from the sheet material so that the sodium hydroxide solution can dissolve away the plastics material relatively uniformly in the region of the ion beam tracks.

The second column of liquid 36, which is arranged on the oppositely located surface of the plastics sheet material, comprises, in this implementation example of FIG. 7, 5% sulphuric acid, the height difference $\Delta$h between the two columns of liquid 35 and 36 producing a hydrostatic pressure which, at the moment when the sheet material of the separating wall 34 has been etched through in the region of the ion tracks, ensures that the etching-stopping solution flows through the openings formed in the surface on the needle-point side and, as a result, stops the etching procedure in the point region of the through-holes through the sheet material.

The two columns of liquid 35 and 36 are accommodated in a U-shaped vessel, with one arm 38 of the U-shaped vessel 37 accommodating the separating wall 34, above which the column of liquid 35 containing the etching solution is located, and with the etching-stopping solution being applied in the lower region of the arm 38, which etching-stopping solution, by virtue of the elevated level of the etching-stopping solution in the second arm 39, exerts a pressure differential to the underside of the separating wall 34 formed by the sheet material to be etched.

Figure 8:
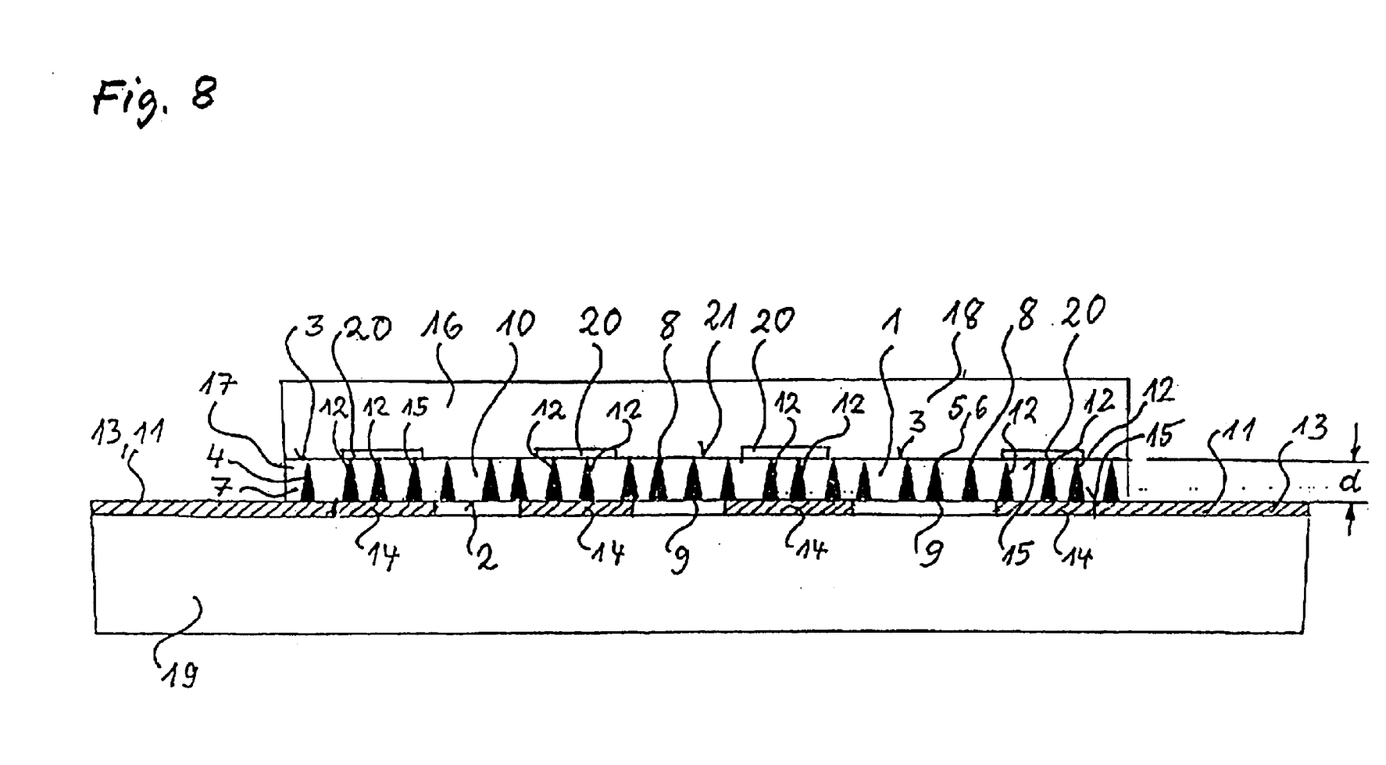
FIG. 8 shows an application example of the sheet material of the first embodiment of the invention.

FIG. 8 shows an application example of the sheet material of the first embodiment of the invention. In FIG. 8, components fulfilling the same functions as in FIG. 1 are given the same reference symbols. It is consequently possible to dispense with explanation of those reference symbols. FIG. 8 shows, moreover, by means of reference symbol 19 a substrate carrier, which has a structured metal coating having conductor tracks 13 and contact connection areas 14. Reference numeral 18 indicates a semiconductor chip, whereas reference numeral 21 indicates the surface of the semiconductor chip and reference numeral 20 denotes contact areas of the semiconductor chip 18.

Arranged between the semiconductor chip 18 and the system carrier 19 is a sheet material 1 of the first embodiment of the invention, the base region of the needle-shaped pins 5 making contact with the contact connection areas 14 of the system carrier 19 and the points 8 of the needle-shaped pins 5 touching the contact areas 20 of the semiconductor chip 18 on the active surface 21 of the semiconductor chip. In order to establish a connection between the contact areas 20 of the semiconductor chip 18 and the contact connection areas 14 of the system carrier 19, the sheet material 1 in no way needs to be structured but merely needs to have the same size area as the semiconductor chip 18 and can be arranged between the semiconductor chip 18 and the system carrier 19 without any special adjustment. Light contact pressure on the semiconductor chip 18 in the direction of the system carrier 19 is sufficient to establish adequate contact between the semiconductor chip 18 and the system carrier 19. Such an embodiment is especially advantageous for mass-produced articles such as semiconductor chips for chip cards or similar applications.

Figure 9:
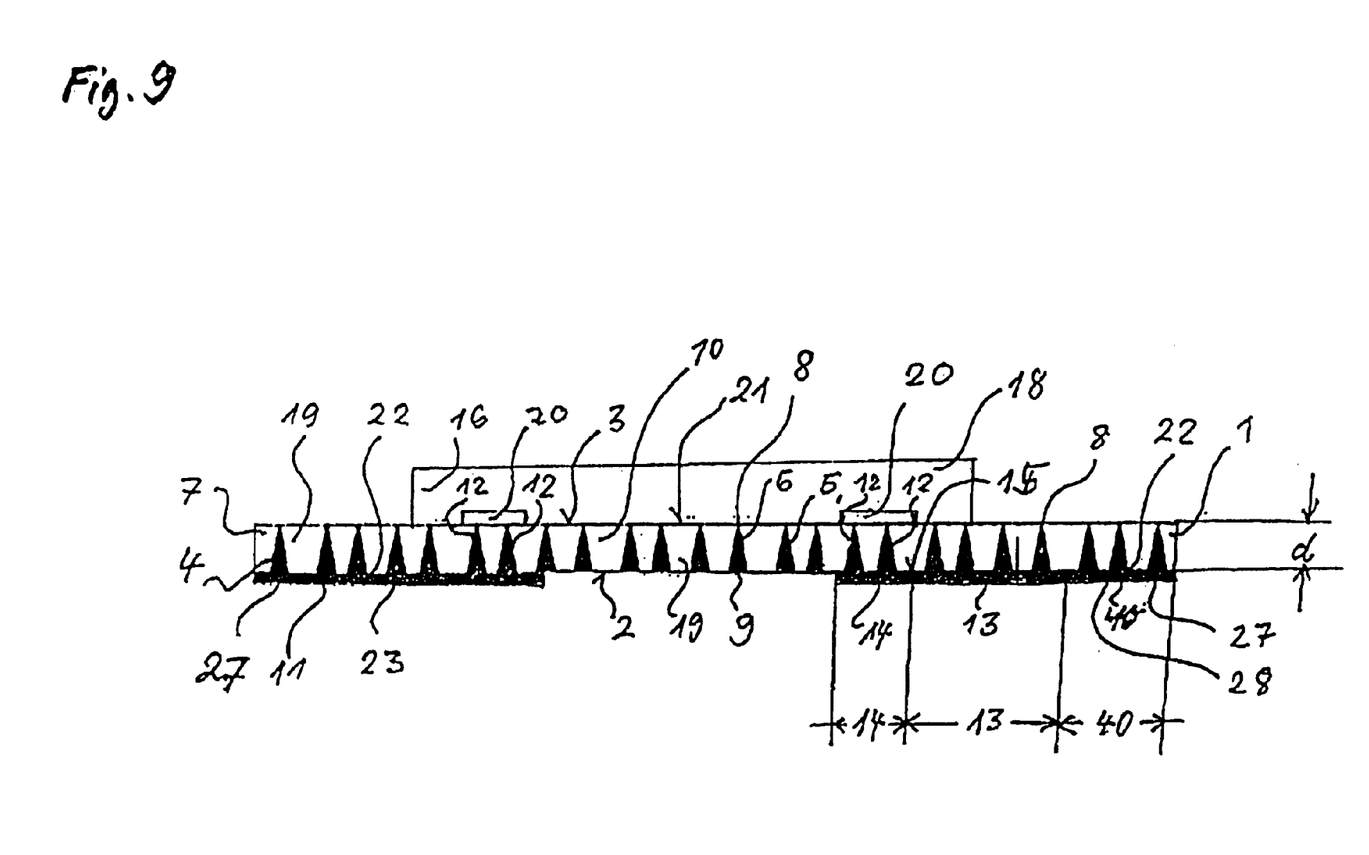
FIG. 9 shows an application example of the sheet material of the second embodiment of the invention.

FIG. 9 shows an application example of the sheet material of the second embodiment of the invention. The sheet material of the second embodiment of the invention has a metal layer on the surface on the base side of the needle-shaped pins 5. That metal layer is, in the application example according to FIG. 9, structured to form conductor tracks 13, external contact tabs 40 and contact areas 14. The external contact tabs 40 are located on the outside and contact can be made with them from the outside. The conductor tracks lead from the contact connection tabs to the contact connection areas 14 and, by way of the needle-shaped pins 5, to the contact areas 20 of the semiconductor chip 18. As a result, the sheet material of the second embodiment of the invention completely replaces the otherwise customary system carrier and, in so doing, contributes to a substantial reduction in the thickness of an electronic component, as shown by FIG. 8.

In addition, the external contact tabs 40 are completely exposed so that the electronic component according to FIG. 9 can be embedded in a chip card and the external contact tabs 40 are made accessible for establishing contact using an automatic machine. In this embodiment too, lightly pressing the system carrier onto the chip is sufficient to establish adequate contact between contact areas 20 of the chip and contact connection areas 14 of the system carrier 19.

Figure 10:
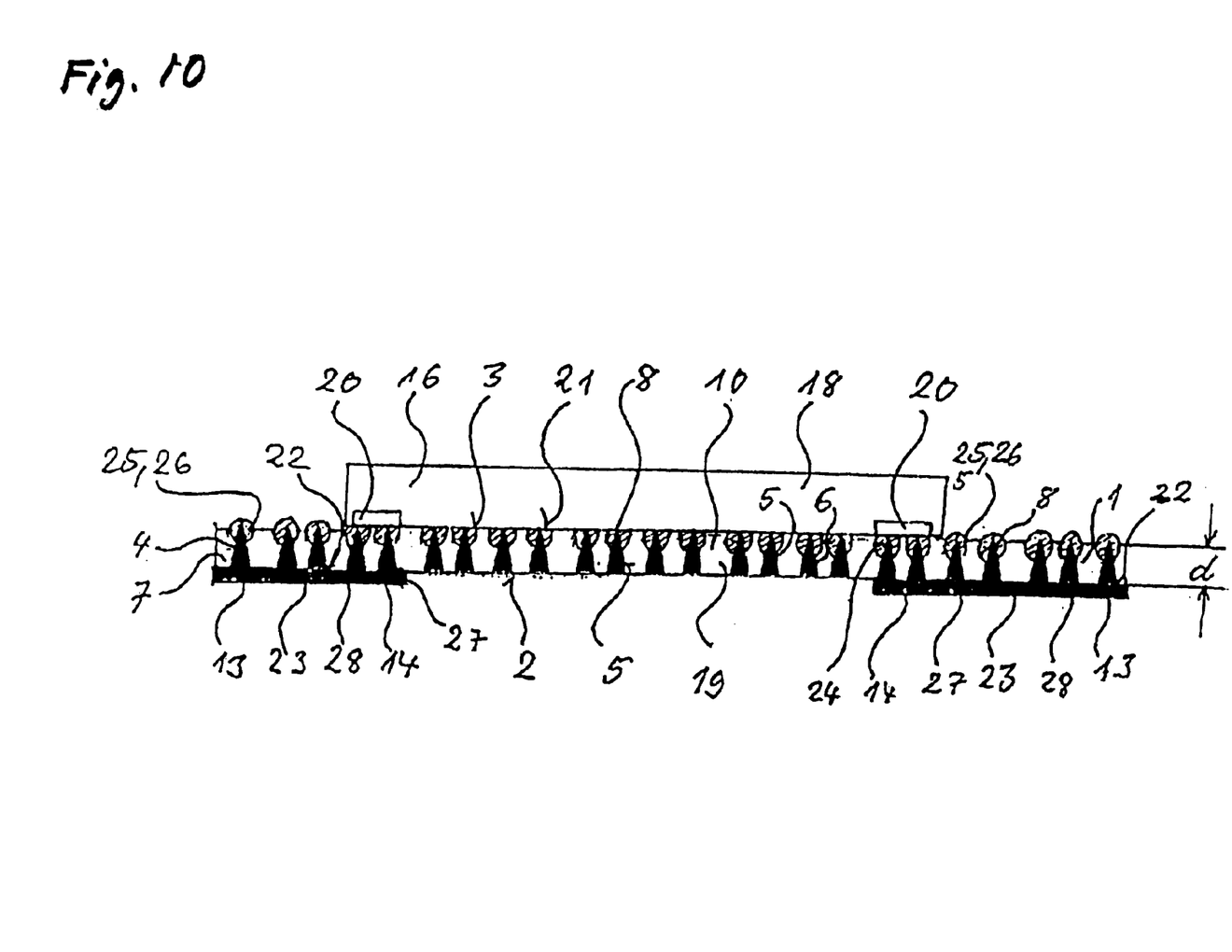
FIG. 10 shows an application example of a variant of the sheet material according to the second embodiment of the invention.

FIG. 10 shows an application example of a variant of the sheet material according to the second embodiment of the invention. Components having the same functions as in FIGS. 1, 2, 8 and 9 are denoted by the same reference symbols and are not explained again. FIG. 10 moreover shows, by means of reference symbol 25, a metallic material 25 in the cavities 24 of the second embodiment of the invention. In this exemplary embodiment of FIG. 10, the metallic material 25 in the cavities 24 consists of a solder. The solder forms, around the points 8 of the needle-shaped pins 5, a ball 26 of solder material which makes a solder connection when the contact areas 20 of a semiconductor chip 18 are connected to the system carrier 19. As a result, an electrical connection which is independent of contact pressure, is created between the contact areas 20 of the semiconductor chip 18 and contact connection areas 14 of the system carrier 19.

What is claimed is:

1. Sheet material having metal points (8) and surfaces (2 and 3) located opposite one another, wherein the sheet material has, at a prespecified angle with respect to the surfaces (2 and 3), through-holes (4) from one surface (2) to the surface (3) located opposite, which taper conically; and the through-holes (4) have needlepoint-shaped conical pins (5) or through-contacts (6) of electrically conducting material, whereas the sheet material (1) consists of insulating plastics material, wherein said points have ball like molded solder material extending said points.

2. Sheet material according to claim 1, wherein the area density of the conically tapering pins (5) or through-contacts (6) is from $1\times10^5$ units per cm$^2$ to $1\times10^7$ units per cm$^2$, preferably from $5\times10^5$ units per cm$^2$ to $1\times10^6$ units per cm$^2$.

3. Sheet material according to claim 1, wherein metallic points (8) of the pins (5) or through-contacts (6) project out from the sheet material (1) on one side.

4. Sheet material according to claim 1, wherein the thickness (d) of the sheet material (1) is from 10 μm to 400 μm, preferably from 20 μm to 300 μm.

5. Sheet material according to claim 1, wherein the needle-point-shaped, conically tapering pins (5) or through-contacts (6) have a rounding-off radius at the point (8) of from 20 nm to 100 nm.

6. Sheet material according to claim 1, wherein the needle-shaped, conical pins (5) or through-contacts (6) have, in their base region (9), a diameter of less than 10 μm, preferably of from 1 μm to 5 μm.

7. Use of the sheet material according to claim 1, wherein the sheet material (1) is used as connecting material (10) in the form of a connecting mat between structured conductor track surfaces of two electronic components and automatically provides coupling points by means of densely distributed, needle-point-shaped, conically tapering metallic pins or through-contacts (12) wherever conductor tracks (13) have oppositely located contact connection areas (14) and/or at locations where exposed conductor track areas (15) of the conductor tracks (13) of the two electronic components cross one another.

8. Use of the sheet material according to claim 1 as selectively electrically connecting material for an electronic component consisting of a plurality of stacked semiconductor devices, the sheet material (1) being arranged between the respective devices.

9. Sheet material according to claim 1, wherein the metallic material (25) for filling and for extending the points (8) is a solder (26).

10. Use of the sheet material according to claim 1 an electrically connecting intermediate layer (17) between a semiconductor chip (18) and a system carrier (19), the system carrier (19) having conductor tracks (13) with contact connection areas (14) and the chip (18) having contact areas (20), and the sheet material (1) establishing, by means of its pins (5) incorporated in an insulated arrangement, electrical connections between the contact areas (10) of the chip (19) and the contact connection areas (14) of the system carrier (19) which are located opposite.

11. Use of the sheet material according to claim 10, wherein, for the establishment of contact, the sheet material (1) covers at least the entire surface (21) of the semiconductor chip (18) on its active side provided with contact areas (20), the conductor tracks (13) of the system carrier (19) and/or the contact connection areas (14) of the system carrier (19) being arranged opposite the contact areas (20) of the semiconductor chip (18).

12. Sheet material according to claim 1, wherein the sheet material (1) has, on its surface (2) on the needle-base side, a metal coating connected to the base ends (22) of the conically tapering pins (5) or through-contacts (6).

13. Sheet material according to claim 12, wherein the metal coating 23 on the surface (2) on the needle-base side has a conduction pattern (27).

14. Sheet material according to claim 12, wherein the metal coating (23) has the conduction pattern (27) of a system carrier (19) having contact connection areas (14) for making contact with contact areas (20) of a semiconductor chip (18).

15. Use of the sheet material according to claim 13 having a structured metal coating (28) and having needle-shaped, conically tapering pins (5) or through-contacts (6) embedded in a plastics layer (7), as a system carrier (19) for an electronic component (16) having a semiconductor chip (18) arranged on the system carrier (19).

16. Use of the sheet material according to claim 13 having a structured metal coating (28) and having needle-shaped, conically tapering pins (5) or through-contacts (6) embedded in a plastics layer (7), the points (8) of which are extended by means of solder material (26), for the production of electronic components (16) having a semiconductor chip (18) which is arranged on the sheet material (1) forming the system carrier (19) and connected to the solder material (26) by means of its contact areas (20).

17. Sheet material of metal having points (8) and surface (31, 32) located opposite one another, wherein the sheet material (1) has, on at least one surface (2), needle-shaped pins (5) which protrude from the surface (2) of the sheet at a prespecified angle and have, in the base region (9) of the pins (5), a diameter of less than 10 $\mu$m, preferably of from 1 to 5 $\mu$m, wherein said points have ball like molded solder material extending said points.

18. Sheet material according to claim 17, wherein the thickness (h) of the sheet material (1), without pins (5), is from 10 to 50 $\mu$m, and the pins (5) have a length (d) of from 10 $\mu$m to 400 $\mu$m, preferably from 20 $\mu$m to 300 $\mu$m.

19. Sheet material according to claim 17, wherein the area density of the pins (5) is from $1\times10^5$ pins per cm$^2$ to $1\times10^7$ pins per cm$^2$, preferably from $5\times10^5$ pins per cm$^2$ to $1\times10^6$ pins per cm$^2$.

20. Use of the sheet material (1) of metal according to claim 17 for press-on contact areas in semiconductor technology.

21. Use of the sheet material (1) of metal according to claim 17 for electron emission components.

22. Method for the production of a sheet material (1) having metal points (8) and having needle-shaped, conically tapering metallic pins (5) or through-contacts (6), which method comprises the following method steps:
irradiating a plastics sheet (7) with ion beams at a prespecified angle,
etching the ion beam tracks in the plastics sheet (7) to form needle-shaped, conically tapering through-holes (4) having a surface (3) on the needle-point side and a surface (2) located opposite on the needle-base side, wherein an etching solution acts onto the plastics sheet on one side at the needle base surface (2), and wherein an etching-stopping solution stops the etching process from the side of the needle top surface (3),
depositing a metal layer (29) on the surface (3) on the needle-point side of the etched sheet (7),
filling the through-holes (4) with metal pins (5) or metallic through-contacts (6) by means of electrodeposition of metal in the through-holes,
etching away the continuous metal layer (29) on the surface (3) on the needle-point side.

23. Method according to claim 22, wherein a plastics sheet (7), preferably of poly (bisphenol A carbonate), having a thickness (d) of from 10 $\mu$m to 400 $\mu$m is irradiated with heavy ions, preferably uranium U$^{238}$ ions.

24. Method according to claim 22, wherein the heavy ions are accelerated to a kinetic energy of from 8 to 15 MeV.

25. Method according to claim 22, wherein there is established an ion irradiation density of from $1\times10^5$ ions per cm$^2$ to $1\times10^7$ ions per cm$^2$, preferably from $5\times10^5$ ions per cm$^2$ to $1\times10^6$ ions per cm$^2$.

26. Method according to claim 22, wherein, for etching the ion beam tracks in the plastics sheet (7), there is used a 6-molar sodium hydroxide solution containing 10% methanol by volume for etching the tracks of the ions at a temperature of from 310 to 320 K to form unilaterally arranged conical through-holes (4) within a period of from 5 to 16 hours, preferably of from 6 to 10 hours.

27. Method according to claim 22, wherein 5% sulphuric acid is used as etching-stopping solution.

28. Method according to claim 22, wherein an etching-stopping solution is subjected to a pressure differential of from 100 to 200 hPa with respect to atmospheric pressure.

29. Method according to claim 22, wherein deposition of a continuous metal layer (29) on the surface (3) on the needle-point side of the etched sheet is carried out by means of sputtering, preferably sputtering of gold, and the sputtered layer is then made thicker by electrodeposition or electroplating using a copper alloy.

30. Method according to claim 22, wherein the conical through-holes (4) are filled by means of electrodeposition of copper.

31. Method for the production of a sheet material (1) of plastics material having metal points (8) and having needle-shaped points (8), which method comprises the following method steps:
irradiating the sheet material (1) with ion beams at a prespecified angle to the surface (2) of the sheet material (1),
etching the ion beam tracks in the sheet material (1) to form needle-point-shaped, conically tapering through-holes (4) having a surface (3) on the needle-point side and a surface (2) located opposite on the needle-base side, wherein an etching solution acts onto the plastics sheet on one side at the needle base surface (2), and wherein an etching-stopping solution stops the etching process from the side of the needle top surface (3),
depositing a metal layer (29) on the surface (3) on the needle-point side of the etched sheet (7),
filling the through-holes (4) with metal pins (5) by means of electrodeposition of metal in the through-holes (4),
depositing a continuous metal layer (23) on the surface (2) on the base side,
etching the continuous metal layer (23) on the surface (3) on the needle-point side.

32. Method according to claim 31, wherein the metal coating 23 on the surface (2) on the needle-base side of the sheet material (1) is structured to form conductor tracks and/or contact connection areas.

33. Method according to claim 31, wherein there is established an ion irradiation density of from $1 \times 10^5$ ions per $cm^2$ to $1 \times 10^7$ ions per $cm^2$, preferably from $5 \times 10^5$ ions per $cm^2$ to $1 \times 10^6$ ions per $cm^2$.

34. Method according to claim 31, wherein, for etching the ion beam tracks in the plastics sheet (7), there is used a 6-molar sodium hydroxide solution containing 10% methanol by volume for etching the tracks of the ions at a temperature of from 310 to 320 K to form unilaterally arranged conical through-holes (4) within a period of from 5 to 16 hours, preferably of from 6 to 10 hours.

35. Method according to claim 31, wherein 5% sulphuric acid is used as etching-stopping solution.

36. Method according to claim 31, wherein an etching-stopping solution is subjected to a pressure differential of from 100 to 200 hPa with respect to atmospheric pressure.

37. Method according to claim 31, wherein deposition of a continuous metal layer (29) on the surface (3) on the needle-point side of the etched sheet is carried out by means of sputtering, preferably sputtering of gold, and the sputtered layer is then made thicker by electrodeposition or electroplating using a copper alloy.

38. Method according to claim 31, wherein the conical through-holes (4) are filled by means of electrodeposition of copper.

39. Method according to claim 31, wherein, for exposure of the needle-shaped metallic points (8), with formation of a cavity (24) surrounding the points (8), the sheet material (1) is partially dissolved away on the surface (3) on the point side.

40. Method according to claim 39, wherein, for filling the cavities (24) or extending the points (8), a metallic material (25) is deposited at the exposed metallic metal points (8) by means of electrodeposition.

41. Method according to claim 39, wherein a solder material (26) is deposited at the exposed needle-shaped metallic points (8).

42. Method according to claim 39, wherein a solder material (26) is applied at the exposed needle-shaped metallic points (8) by means of a flow bath method.

43. Method according to claim 39, wherein a solder material (26) is applied at the exposed needle-shaped metallic points (8) by means of an immersion bath method.

44. Method according to claim 39, wherein exposure of the points (8) of the deposited metallic conical pins (5) is carried out by partially dissolving away the plastics sheet (7) using dichloromethane.

45. Method for the production of a metal sheet having metal points (8) and having exposed needle-shaped pins (5), which method comprises the following method steps:

irradiating a plastics sheet (7) with ion beams at a pre-specified angle, etching the ion beam tracks in the plastics sheet (7) to form needle-point-shaped, conically tapering through-holes (4) having a surface (3) on the needle-point side and a surface (2) located opposite on the needle-base side, wherein an etching solution acts onto the plastics sheet on one side at the needle base surface (2), and wherein an etching-stopping solution stops the etching process from the side of the needle top surface (3), depositing a metal layer (29) on the surface (3) on the needle-point side of the etched sheet, filling the through-holes (4) with metal pins (5) by means of electrodeposition of metal in the through-holes (4), applying a connecting metal layer to the surface (2) on the needle-base side, etching the continuous metal layer (29) on the surface (3) on the needle-point side.

completely dissolving away the plastics sheet material (7) between the needle-shaped points (4).

46. Method according to claim 45, wherein a plastics sheet (7), preferably of poly (bisphenol A carbonate), having a thickness (d) of from 10 $\mu$m to 400 $\mu$m is irradiated with heavy ions, preferably uranium $U^{238}$ ions.

47. Method according to claim 45, wherein the heavy ions are accelerated to a kinetic energy of from 8 to 15 MeV.

48. Method according to claim 45, wherein there is established an ion irradiation density of from $1 \times 10^5$ ions per $cm^2$ to $1 \times 10^7$ ions per $cm^2$, preferably from $5 \times 10^5$ ions per $cm^2$ to $1 \times 10^6$ ions per $cm^2$.

49. Method according to claim 45, wherein, for etching the ion beam tracks in the plastics sheet (7), there is used a 6-molar sodium hydroxide solution containing 10% methanol by volume for etching the tracks of the ions at a temperature of from 310 to 320 K to form unilaterally arranged conical through-holes (4) within a period of from 5 to 16 hours, preferably of from 6 to 10 hours.

50. Method according to claim 45, wherein 5% sulphuric acid is used as etching-stopping solution.

51. Method according to claim 45, wherein an etching-stopping solution is subjected to a pressure differential of from 100 to 200 hPa with respect to atmospheric pressure.

52. Method according to claim 45, wherein deposition of a continuous metal layer (29) on the surface (3) on the needle-point side of the etched sheet is carried out by means of sputtering, preferably sputtering of gold, and the sputtered layer is then made thicker by electrodeposition or electroplating using a copper alloy.

53. Method according to claim 45, wherein the conical through-holes (4) are filled by means of electrodeposition of copper.

54. Method according to claim 45, wherein exposure of the points (8) of the deposited metallic conical pins (5) is carried out by partially dissolving away the plastics sheet (7) using dichloromethane.

55. Method according to claim 45, wherein the plastics sheet material (7) between the needle-shaped pins (5) on the metal coating (23) on the needle-base side is completely dissolved away using dichloromethane.

\* \* \* \* \*